(12) United States Patent
Kim et al.

(10) Patent No.: US 12,720,722 B2
(45) Date of Patent: Aug. 25, 2026

(54) FABRICATING SEMICONDUCTOR DEVICE

(71) Applicant: SAMSUNG ELECTRONICS CO., LTD., Suwon-si (KR)

(72) Inventors: Sookyung Kim, Suwon-si (KR); Chan Hwang, Suwon-si (KR); Jeonghee Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 385 days.

(21) Appl. No.: 18/352,191

(22) Filed: Jul. 13, 2023

(65) Prior Publication Data

US 2024/0023305 A1 Jan. 18, 2024

(30) Foreign Application Priority Data

Jul. 15, 2022 (KR) ........................ 10-2022-0087755

(51) Int. Cl.
*H10B 12/00* (2023.01)
*H10D 1/00* (2025.01)
*H10D 1/68* (2025.01)

(52) U.S. Cl.
CPC ............. *H10B 12/03* (2023.02); *H10D 1/043* (2025.01); *H10D 1/716* (2025.01)

(58) Field of Classification Search
CPC ........... H10D 30/6723; H10D 86/0231; H10D 86/441; H10D 86/451; H10D 86/60; H10D 99/00; H01L 21/31144
See application file for complete search history.

(56) References Cited

U.S. PATENT DOCUMENTS

| | | | | |
|---|---|---|---|---|
| 8,552,538 | B2 | 10/2013 | Daley et al. | |
| 9,772,559 | B2 | 9/2017 | Cheng et al. | |
| 11,050,004 | B2 | 6/2021 | Liu et al. | |
| 11,217,594 | B2 * | 1/2022 | Huang | H10B 12/482 |
| 12,193,337 | B2 * | 1/2025 | Ou | H10B 61/22 |
| 2011/0003257 | A1 | 1/2011 | Wang et al. | |
| 2013/0210229 | A1 | 8/2013 | Ogihara et al. | |
| 2014/0017616 | A1 | 1/2014 | Chang | |

(Continued)

FOREIGN PATENT DOCUMENTS

| | | | |
|---|---|---|---|
| CN | 111354728 A * | 6/2020 | H10W 10/0143 |
| EP | 2628745 | 8/2013 | |

(Continued)

OTHER PUBLICATIONS

Extended European Search Report in European Appln. No. 23185209.6, mailed on Dec. 7, 2023, 7 pages.

(Continued)

*Primary Examiner* — Edward Chin
(74) *Attorney, Agent, or Firm* — Fish & Richardson P.C.

(57) ABSTRACT

A method of fabricating a semiconductor device includes forming a photoresist layer on a lower structure to have a first thickness, exposing a portion of the photoresist layer to form an exposed portion and a non-exposed portion of the photoresist layer, removing a part of the photoresist layer to form a photoresist layer having a second thickness that smaller than the first thickness, and removing the exposed portion or the non-exposed portion of the photoresist layer having the second thickness to form a photoresist pattern.

17 Claims, 11 Drawing Sheets

(56) References Cited

U.S. PATENT DOCUMENTS

| | | | | |
|---|---|---|---|---|
| 2015/0187802 | A1* | 7/2015 | Lee | H10D 86/0231 257/734 |
| 2017/0199457 | A1 | 7/2017 | Hatakeyama et al. | |
| 2019/0103306 | A1 | 4/2019 | Lin et al. | |
| 2019/0348418 | A1* | 11/2019 | Hwang | H10B 12/30 |
| 2021/0397081 | A1 | 12/2021 | Cheng et al. | |
| 2022/0342316 | A1* | 10/2022 | Kooiman | G06T 7/001 |

FOREIGN PATENT DOCUMENTS

| | | | | | |
|---|---|---|---|---|---|
| KR | 10-1997-0023808 | | | 5/1997 | |
| KR | 10-2010-0081937 | A | | 7/2010 | |
| KR | 20100081937 | A | * | 7/2010 | G03F 1/80 |
| KR | 10-2015-0076878 | A | | 7/2015 | |
| KR | 10-2022-0030573 | A | | 3/2022 | |

OTHER PUBLICATIONS

Office Action in Korean Appln. No. 10-2022-0087755, mailed on Feb. 5, 2026, 24 pages (with English translation).

* cited by examiner

100

195
194
192
CAP
194
191
193
195
160
164
162
168
165
148
BC
147
146
155
BLS
SS
143
150
BL
142
128
141
DC
105a
105b
ACT
110
101
I
I'
Z
X
Y

FABRICATING SEMICONDUCTOR DEVICE

CROSS-REFERENCE TO RELATED APPLICATION(S)

This application claims benefit of priority to Korean Patent Application No. 10-2022-0087755 filed on Jul. 15, 2022, in the Korean Intellectual Property Office, the disclosure of which is incorporated herein by reference in its entirety.

BACKGROUND

Methods of fabricating a semiconductor device can include a photolithography process.

Research has been conducted to reduce sizes of elements included in a semiconductor device and to improve performance of the semiconductor device. For example, in a dynamic random-access memory (DRAM), research has been conducted to reliably and stably form elements having a reduced size.

SUMMARY

The present disclosure is directed toward fabricating semiconductor devices including photolithography processes for improving distribution of a photoresist pattern and preventing the photoresist pattern from collapsing. Though thicker photoresist layers, e.g., 400 Å or more, generally improve the distribution of a photoresist pattern and thinner photoresist layers, 600 Å or less, generally prevent the photoresist pattern from collapsing, the disclosed methods, in some implementations, can simultaneously address both goals.

In general, innovative aspects of the subject matter described in this specification can be embodied in methods of fabricating a semiconductor device that include: forming a photoresist layer on a lower structure to have a first thickness; exposing a portion of the photoresist layer to form an exposed portion and a non-exposed portion of the photoresist layer; removing a portion of the photoresist layer to form a photoresist layer having a reduced thickness that is smaller than the first thickness; and forming a photoresist pattern by removing the exposed portion or the non-exposed portion of the photoresist layer having the reduced thickness.

In general, in another aspect, subject matter of the present disclosure can be embodied in methods of fabricating a semiconductor device that include: loading a lower structure into a spinner; forming a photoresist layer on the lower structure; unloading a first substrate including the lower structure and the photoresist layer from the spinner; loading the first substrate into a scanner, after the unloading the first substrate; forming an exposed portion and a non-exposed portion in a first region and a second region of the photoresist layer using an exposure process, respectively, after the loading the first substrate into the scanner; unloading a second substrate including the lower structure and the photoresist layer having the exposed portion and the non-exposed portion from the scanner, after the forming the exposed portion and the non-exposed portion of the photoresist layer; loading the second substrate into the spinner, after the unloading the second substrate; partially removing part of the photoresist layer to reduce a thickness of the photoresist layer of the second substrate, after the loading the second substrate into the spinner; and removing the non-exposed portion of the photoresist layer having the reduced thickness to form a pillar photoresist pattern.

In general, other aspects of the present disclosure can be embodied in methods of fabricating a semiconductor device that include: forming a substrate including active regions; forming word lines crossing the active regions on the substrate; forming bit lines intersecting the word lines and electrically connected to first impurity regions of the active regions on the substrate; forming lower conductive patterns electrically connected to second impurity regions of the active regions and disposed between the bit lines adjacent to each other; and forming upper conductive patterns electrically connected to the lower conductive patterns. The forming the upper conductive patterns include: forming an upper conductive layer covering the lower conductive patterns; forming a photoresist layer having a first thickness and on the upper conductive layer; forming an exposed portion and a non-exposed portion in a first region and a second region of the photoresist layer using an exposure process, respectively; removing part of the photoresist layer such that the photoresist layer has a second thickness that is smaller than the first thickness; selectively removing the non-exposed portion of the photoresist layer to form a photoresist pattern; forming an opening separating the upper conductive layer into the upper conductive patterns using the photoresist pattern as an etching mask; and forming an insulating pattern in the opening.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, examples of implementations of the present disclosure will be described with reference to the accompanying drawings.

Figure 1:
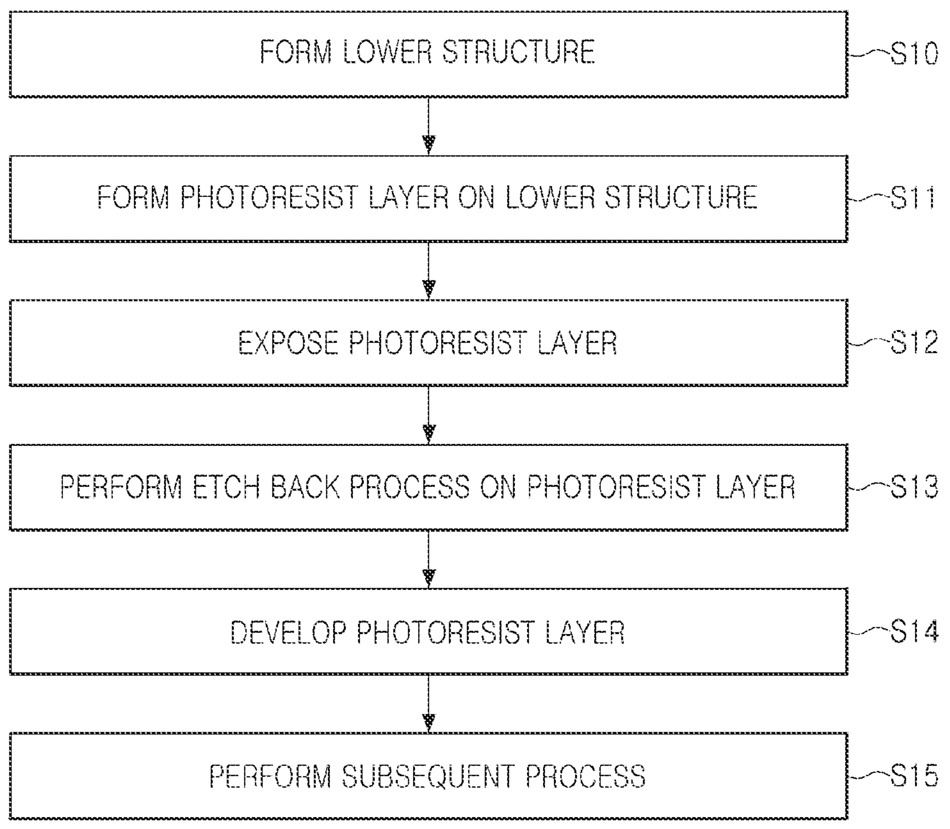
FIG. 1 is a schematic process flowchart illustrating an example of a method of fabricating a semiconductor device.

FIG. 1 is a schematic process flowchart illustrating an example of a method of fabricating a semiconductor device. FIGS. 2A to 2F are schematic cross-sectional views illustrating an example of a method of fabricating a semiconductor device.

A method of fabricating a semiconductor device may include a photolithography process. For example, the method may include forming a lower structure (S10), forming a photoresist layer on the lower structure (S11), exposing a photoresist layer (S12), performing an etch back process on the photoresist layer (S13), developing the photoresist layer (S14), and performing a subsequent process (S15).

Figure 2A:
FIGS. 2A to 2F are schematic cross-sectional views illustrating an example of a method of fabricating a semiconductor device.

Referring to FIGS. 1 and 2A, forming the lower structure may include forming a target layer 11 on the substrate 10.

The composition of the substrate 10 is not limited. For example, in some implementations, the substrate 10 is a silicon substrate, a germanium substrate, a silicon-germanium substrate, a silicon-on-insulator (SOI) substrate, a germanium-on-insulator (GOI) substrate, or the like. The substrate 10 may include, for example, a group III-V compound such as GaP, GaAs, GaSb, or the like.

Figure 2B:
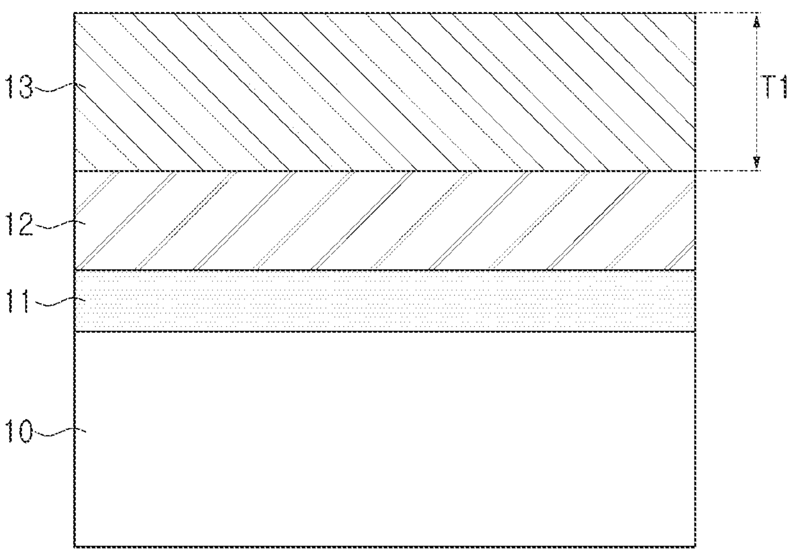
Figure 2C:
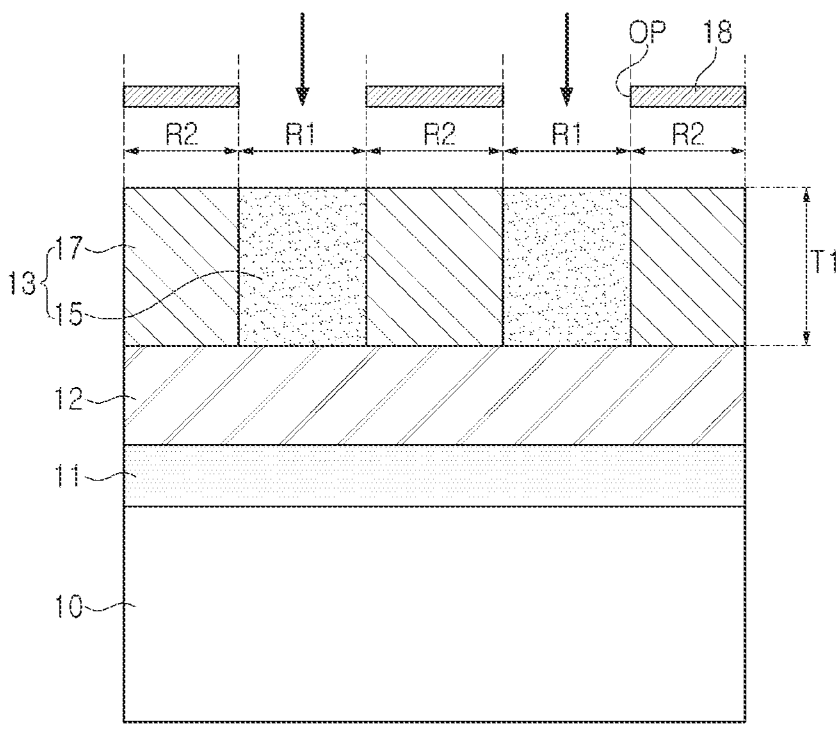
Figure 2D:
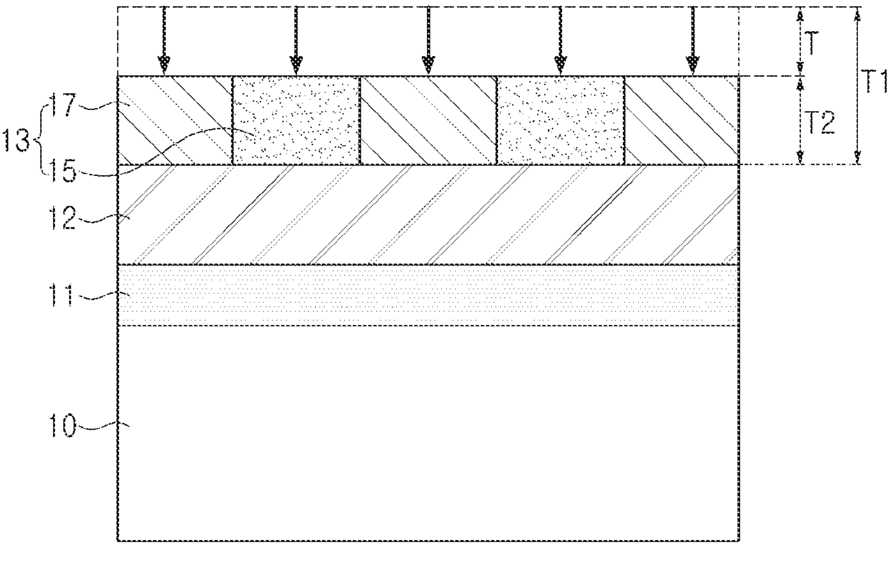
Figure 2E:
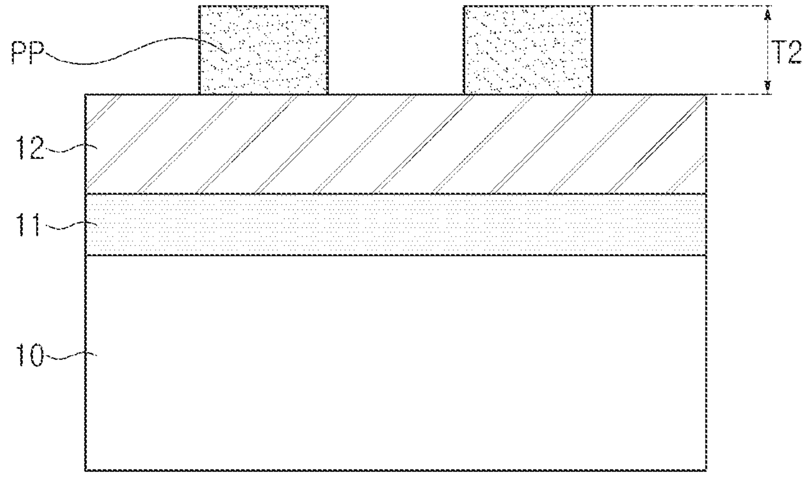
Figure 2F:
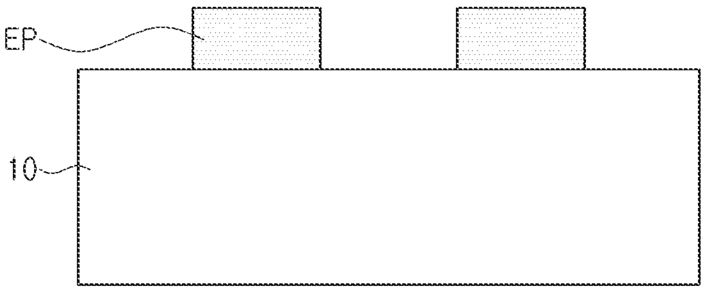

The target layer 11 may be a layer in which an image is transferred from a photoresist pattern and converted into a target pattern (EP in FIG. 2F). The composition of the target layer 11 is not limited. For example, in some implementations, the target layer 11 is be formed of an insulating material such as silicon oxide, silicon nitride, silicon oxynitride, or the like. In some implementations, the target layer 11 is formed of a conductive material such as a metal, metal nitride, metal silicide, or metal silicide nitride film, or a semiconductor material such as polysilicon.

The target layer 11 may be formed on the substrate 10 by, for example, at least one of a chemical vapor deposition (CVD) process, a plasma enhanced chemical vapor deposition (PECVD) process, a low-pressure chemical vapor deposition (LPCVD) process, a high-density plasma chemical vapor deposition (HDP-CVD) process, a spin coating process, a sputtering process, an atomic layer deposition (ALD) process, and a physical vapor deposition (PVD) process.

Although not illustrated, the lower structure may further form an antireflection film on the target layer 11. The antireflection film may be formed using an aromatic organic material (for example, phenol resin, novolac resin, or the like) or an inorganic material (for example, silicon oxynitride, or the like). The antireflection film may be formed using a film coating process such as spin coating, dip coating, spray coating, or the like.

Referring to FIGS. 1 and 2B, a photoresist layer 13 may be formed on the lower structure (S11).

The photoresist layer 13 may be a layer having properties being changed by, for example, causing a chemical reaction when light is irradiated. The photoresist layer 13 may be a layer being converted into a photoresist pattern (PP in FIG. 2E) by a developing process to be described below. The photoresist layer 13 may be formed of a positive type photoresist having an exposure property in which a portion irradiated with light is removed by a developer, or a negative type photoresist having an exposure property in which a portion not irradiated with light is removed by a developer. In some implementations, the photoresist layer 13 is a negative type photoresist layer.

The photoresist layer 13 may include an organic photoresist. For example, in some implementations, the photoresist layer 13 includes a chemically amplified photoresist including a polymer resin, a photosensitive compound, and a base. The photosensitive compound may be decomposed into an acidic compound when irradiated with light to generate an acid. The polymer resin included in the photoresist layer 13 may be decomposed by the acid generated by the photosensitive compound. The decomposed polymer resin may be removed by a developer in the developing process. A polymer may be, for example, acrylate, styrene, or the like. The base may prevent the acid generated by the photosensitive compound from spreading to a region not irradiated with light. The base may neutralize the acid generated by the photosensitive compound in a non-exposed region.

However, the composition of the photoresist layer 13 is not limited thereto. For example, in some implementations, the photoresist layer 13 includes an inorganic photoresist for performing an extreme ultraviolet (EUV) photolithography process. The inorganic photoresist may include a metal oxide, for example, tin oxide ($SnO_x$).

The photoresist layer 13 may be formed on the lower structure using a film coating process such as a spin coating process, a dip coating process, a spray coating process, or the like. In some implementations, the photoresist layer 13 is formed using a curing process such as a baking process after forming a preliminary photoresist film by coating a photoresist composition.

The photoresist layer 13 may be formed to have a first thickness T1. In some implementations, the first thickness T1 is in a range from about 400 Å to about 1000 Å. When discussing ranges, "about" can refer to a range of values slightly above or below the indicated amount, e.g., a range spanning 10% more or less than the indicated amount, 5% more or less than the indicated amount, or 1% more or less than the indicated amount. As the photoresist layer 13 is formed to have a thickness of about 400 Å or more, optical efficiency of the photoresist layer 13 may be increased. Here, "optical efficiency" refers to an amount of acid generated per dose of radiation. An amount of acid generated by each photon may be increased by the photoresist layer 13 formed to have the thickness of about 400 Å or more. Accordingly, even when EUV having a relatively small number of photons is used as compared to a light source such as KrF, ArF, or the like, a fine pattern having reduced line width roughness (LWR) may be implemented. The photoresist layer 13 may be formed to have a thickness of about 1000 Å or less, thereby alleviating a process burden in an operation of etching the photoresist layer 13 to be described below.

In some implementations, an adhesive layer 12 is formed between the lower structure and the photoresist layer 13. The adhesive layer 12 may be a layer formed to improve adhesion between the lower structure and the photoresist layer 13.

Referring to FIGS. 1 and 2C, the photoresist layer 13 is exposed (S12). A photomask 18 may be disposed on the photoresist layer 13. The photomask 18 may include a transmissive portion OP exposing a first region R1 of the photoresist layer 13. The photomask 18 may expose the first region R1 of the photoresist layer 13 and mask a second region R2 of the photoresist layer 13.

A light source may illuminate the photomask 18 in an exposure process. The photoresist layer 13 may be divided into an exposed portion 15 and a non-exposed portion 17 by the exposure process. The photoresist layer 13 may include the exposed portion 15 and the non-exposed portion 17. Light emitted from the light source may pass through the transmissive portion OP of the photomask 18 to be irradiated onto the first region R1 of the photoresist layer 13. The first region R1 of the photoresist layer 13 may react with light to change, for example, a chemical structure. Accordingly, the exposed portion 15 may be formed in the first region R1 of the photoresist layer 13. In the second region R2 of the photoresist layer 13, light may be blocked by the photomask 18. The second region R2 of the photoresist layer 13 may not react with light and may be included in the non-exposed portion 17. The exposed portion 15 and the non-exposed portion 17 may have substantially the same height, for example, the first thickness T1.

A type of light source used in the exposure process is not limited. For example, in some implementations, a light source such as EUV, ArF, KrF, electron beam, I-line, or the like is used in the exposure process. The EUV may include a smaller number of photons, as compared to light sources such as KrF, ArF, and the like. In the examples set forth herein, the photoresist layer 13 is formed to have a first thickness T1. The first thickness T1 can be sufficiently large such that, when an EUV light source is used, it is also possible to implement a fine pattern having reduced roughness.

Referring to FIGS. 1 and 2D, portions of the photoresist layer 13 may be partially removed. For example, the photoresist layer 13 may be etched to a remove a predetermined thickness T thereby reducing a thickness of the photoresist layer 13 from the first thickness T1 to the second thickness T2. In some implementations, the photoresist layer 13 is reduced in thickness by an etch back process. That is, the photoresist layer 13 may have the reduced thickness.

When the photoresist layer 13 is developed in a state in which the first thickness (T1 in FIG. 2C) of the photoresist layer 13 is maintained, collapse of the photoresist pattern may occur due to a high aspect ratio thereof. For example, the collapse of the photoresist pattern may occur due to surface tension of a cleaning solution used for cleaning after development. In particular, as the pattern is miniaturized, a contact area between the photoresist pattern and the lower structure may decrease, such that the collapse of the pattern may be more likely to occur. In the method of fabricating a semiconductor device, the thickness of the photoresist layer 13 may be reduced to the second thickness T2 after the exposure process and before the developing process, thereby improving line width roughness of the photoresist pattern to improving resolution and preventing the photoresist pattern from collapsing to improving stability.

In some implementations, the second thickness T2 of the photoresist layer 13 is in a range from about 250 Å to about 600 Å. As the photoresist layer 13 is formed to a thickness of about 250 Å or more, the photoresist layer 13 is thick enough to function as an etch mask, as will be described below. As the photoresist layer 13 is formed to have a thickness of about 600 Å or less, an aspect ratio of the photoresist pattern may be lowered, thereby preventing the photoresist pattern from collapsing.

Before the exposure process, the photoresist layer 13 may be formed to have a relatively large thickness, thereby promoting diffusion of acid. After the exposure process and before the developing process, the photoresist layer 13 may be formed to have a relatively small thickness, thereby preventing the photoresist pattern from collapsing. Accordingly, resolution and pattern stability of the photolithography process may be improved.

The method of fabricating a semiconductor device according to example embodiments may further include performing a post exposure bake (hereinafter, "PEB") process. The PEB process may be a process performed to flatten a surface of the photoresist layer 13 and reduce standing waves. A grain generated at a photosensitive interface due to light interference (amplification and attenuation) during exposure may be removed by the PEB process. Accordingly, a curvature generated in a boundary cross-section in the photoresist layer 13 may be removed, thereby improving a degree of precision of the subsequent process performed using the photoresist pattern. The PEB process may be performed at an operation after exposure and before etch back of the photoresist layer 13, or after etch back and before development of the photoresist layer 13.

Referring to FIGS. 1 and 2E, the photoresist layer may be developed (S14).

The non-exposed portion 17 (in FIG. 2D) of the photoresist layer 13 may be selectively removed, and only the exposed portion 15 (in FIG. 2D) may remain. The exposed portion remaining on the adhesive layer 12 may be included in the photoresist pattern PP. In some implementations, the photoresist pattern PP is formed by a negative tone development (NTD) process, but the present disclosure is not limited thereto. In other implementations, the photoresist pattern PP is formed by a positive tone development (PTD) process.

In some implementations, the photoresist pattern PP includes a plurality of pillar patterns. However, a shape of the photoresist pattern is not limited to a pillar shape and may be changed depending on a pattern transferred to the target layer 11. The photoresist pattern may have the second thickness T2 due to the etch back process (FIG. 2D), thereby preventing the photoresist pattern from collapsing in the developing process.

Referring to FIGS. 1 and 2F, the subsequent process may be performed using the photoresist pattern (S15).

With reference to FIG. 2E, in some implementations, an etching process is performed on the target layer 11 using the photoresist pattern PP as an etching mask. Depending on etch selectivity between the photoresist pattern and the target layer 11, the etching process may include a dry etching process or a wet etching process.

When the target layer 11 is etched, the adhesive layer 12 may be etched together. After a target pattern EP is formed, the photoresist pattern PP and the adhesive layer 12 used as an etching mask may be removed. Accordingly, the target pattern EP may be formed on the substrate 10.

The etching process is illustrated as an example of the subsequent process in FIG. 2F, but the present disclosure is not limited thereto. In other implementations, an ion implantation process is performed using the photoresist pattern as a mask.

Figure 3:
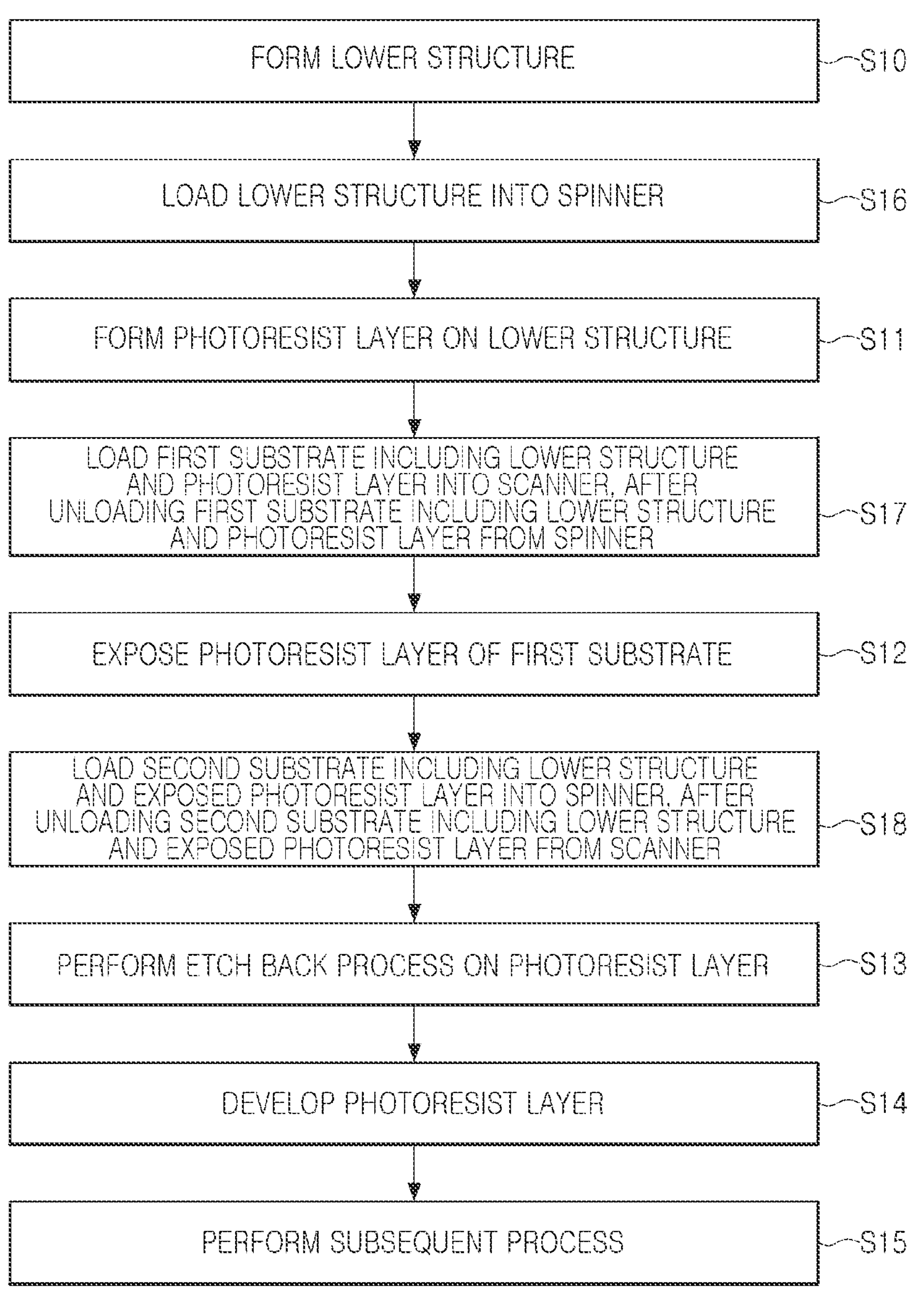
FIG. 3 is a schematic process flowchart illustrating an example of a method of fabricating a semiconductor device.

FIG. 3 is a schematic process flowchart illustrating an example of a method of fabricating a semiconductor device. In the method of fabricating a semiconductor device, a photolithography process may be performed to reduce a turnaround time (TAT). For example, the above-described etch back process of the photoresist layer depicted in FIG. 2D may be performed by equipment same as those of successive processes, thereby minimizing movement.

Referring to FIGS. 2A to 2F and FIG. 3 together, a lower structure may be first formed (FIG. 2A and S10 in FIG. 3).

Thereafter, the lower structure may be loaded into a spinner (S16 in FIG. 3). The spinner may form the photoresist layer 13 on the lower structure (FIG. 2B and S11 in FIG. 3).

A first substrate including the lower structure and the photoresist layer may be unloaded from the spinner. Thereafter, the first substrate including the lower structure and the photoresist layer may be loaded into a scanner. Accordingly, the first substrate including the lower structure and the photoresist layer may be unloaded from the spinner and loaded into a scanner (S17 in FIG. 3). The scanner may expose the photoresist layer 13 (FIG. 2C and S12 in FIG. 3). Accordingly, the exposed portion 15 and the non-exposed portion 17 may be formed on the photoresist layer 13.

A second substrate including the lower structure and the exposed photoresist layer may be unloaded from the scanner. Thereafter, the second substrate including the lower structure and the exposed photoresist layer may be loaded into the spinner. Accordingly, the second substrate including the lower structure and the exposed photoresist layer may be unloaded from the scanner and loaded into the spinner (S18 in FIG. 3). The spinner may perform an etch back process on the photoresist layer 13 to have a second thickness T2 (FIG. 2D and S13 in FIG. 3). Thereafter, the spinner may develop the photoresist layer 13 (FIG. 2E and S14 in FIG. 3).

Accordingly, the exposed portion 15 of the photoresist layer 13 may selectively remain to form the photoresist pattern PP.

Thereafter, a third substrate including the lower structure the photoresist pattern PP may be unloaded from the spinner, and a subsequent process may be performed on the third substrate (S15 in FIG. 3).

The method of fabricating a semiconductor device may further include performing a PEB process on the photoresist layer 13. The PEB process of the photoresist layer 13 may be performed by the spinner before or after the etch back process of the photoresist layer 13 (FIG. 2D and S13 in FIG. 3).

As described above, the process (S13) of etching back the photoresist layer may be performed by equipment the same as those of processes successive before or after, for example, in a spinner. Accordingly, the TAT may be shortened by reducing movement of a structure.

The methods for fabricating a semiconductor device according to the present disclosure may be applied to other components included in the semiconductor device. For example, in some implementations, the method of fabricating a semiconductor device is applied to a process of forming a conductive pattern of a semiconductor device, for example, a landing pad of a DRAM.

Figure 4:
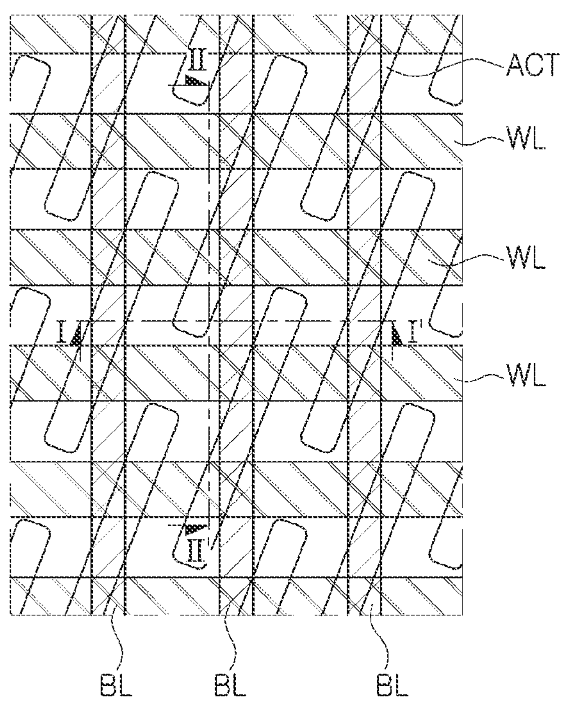
FIG. 4 is a schematic layout diagram illustrating an example of a method of fabricating a semiconductor device.

Examples of methods of fabricating a semiconductor device and examples of structures of the semiconductor device fabricated by the methods will be described with reference to FIGS. 4 to 12. FIG. 4 is a schematic layout diagram illustrating an example of a semiconductor device, and FIGS. 5 to 12 are schematic cross-sectional views of an example of a semiconductor device during fabrication illustrating regions taken along lines I-I' and II-II' of FIG. 4.

Figure 5:
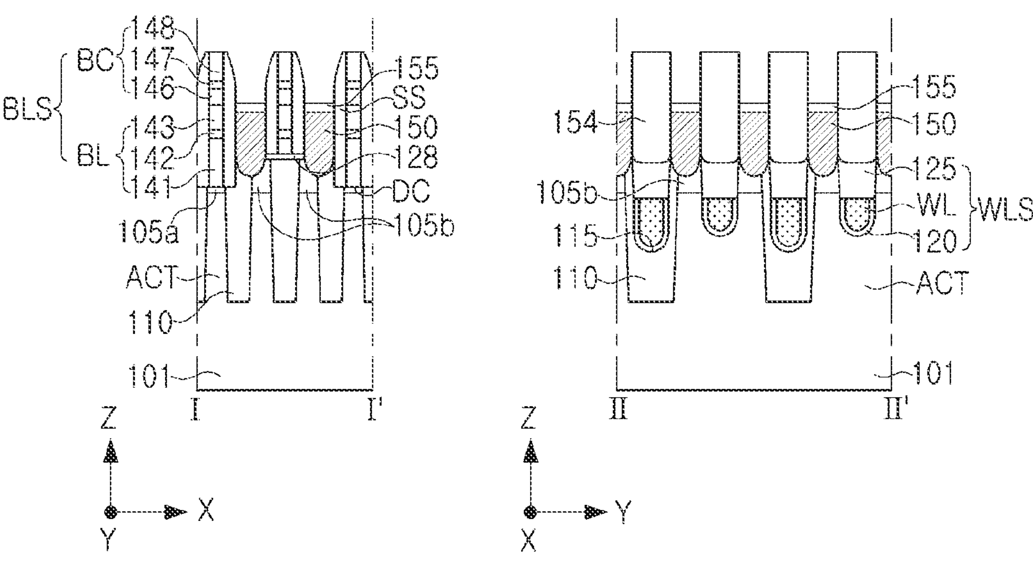
FIGS. 5 to 12 are schematic cross-sectional views illustrating an example of a method of fabricating a semiconductor device.

Referring to FIGS. 4 and 5, a lower structure may be formed. The lower structure may include a substrate 101, word line structures WLS, bit line structures BLS, lower conductive patterns 150, and the like.

A device isolation layer 110 may be formed in the substrate 101 to define an active region ACT. A device isolation trench may be formed in the substrate 101, and the device isolation layer 110 may fill the device isolation trench. In a plan view, the active region ACT may have an elongated bar shape extending in a direction, oblique to a direction of extension of a word line WL. An ion implantation process may be performed to form impurity regions on an upper portion of the active region ACT. The active region ACT and the device isolation layer 110 may be patterned to form a gate trench 115. A pair of gate trenches 115 may cross the active region ACT, but the present disclosure is not limited thereto. The impurity regions may also be separated by the gate trench 115 to form a first impurity region 105*a* and a second impurity region 105*b*.

A gate dielectric layer 120 may be formed on the inner surface of the gate trench 115 to have a substantially conformal thickness. Subsequently, the word line WL may be formed to fill at least a portion of the gate trench 115. An upper surface of the word line WL may be recessed to be lower than an upper surface of the active region ACT. An insulating layer may be stacked on the substrate 101 to fill and etch the gate trench 115, thereby forming a gate capping layer 125 on the word line WL.

An insulating layer and a conductive layer may be sequentially formed and patterned on a front surface of the substrate 101 to form a buffer insulating layer 128 and a first conductive pattern 141 being sequentially stacked. The buffer insulating layer 128 may be formed of at least one of silicon oxide, silicon nitride, and silicon oxynitride. A plurality of buffer insulating layers 128 may be formed to be spaced apart from each other. The first conductive pattern 141 may have a shape corresponding to a planar shape of the buffer insulating layer 128. The buffer insulating layer 128 may be formed to simultaneously cover ends of two adjacent active regions ACT, that is, adjacent second impurity regions 105*b*. A bit line contact hole may be formed by etching upper portions of the device isolation layer 110, the substrate 101, and the gate capping layer 125 using the buffer insulating layer 128 and the first conductive pattern 141 as an etching mask. The bit line contact hole may expose the first impurity region 105*a*.

A bit line contact pattern DC filling the bit line contact hole may be formed. Forming the bit line contact pattern DC may include forming a conductive layer filling the bit line contact hole and performing a planarization process. As an example, the bit line contact pattern DC may be formed of polysilicon. After a second conductive pattern 142, a third conductive pattern 143, and first to third capping patterns 146, 147, and 148 are formed on the first conductive pattern 141, the first to third conductive patterns 141, 142, and 143 may be sequentially etched using the three capping patterns 146, 147, and 148 as an etching mask. As a result, a bit line structure BLS including a bit line BL including the first to third conductive patterns 141, 142, and 143 and a bit line capping pattern BC including the first to third capping patterns 146, 147, and 148 may be formed. The bit line BL may intersect the word line WL. The bit line BL may electrically connect the first impurity region 105*a* of the active region ACT.

A spacer structure SS may be formed on side surfaces of the bit line structure BLS. The spacer structure SS may be formed of a plurality of layers. Fence insulating patterns 154 may be formed between the spacer structures SS. The fence insulating patterns 154 may include silicon nitride or silicon oxynitride. An opening exposing the second impurity region 105*b* may be formed by performing an anisotropic etching process using the fence insulating patterns 154 and the third capping pattern 148 as an etching mask.

The lower conductive patterns 150 may be formed on a lower portion of the opening. The lower conductive patterns 150 may electrically connect the second impurity regions 105*b* of the active regions ACT. The lower conductive patterns 150 may be formed between the bit lines BL adjacent to each other. The lower conductive patterns 150 may be formed of a semiconductor material such as polysilicon. For example, the lower conductive patterns 150 may be formed by forming a polysilicon layer filling the opening, and then performing an etch back process.

A metal-semiconductor compound layer 155 may be formed on the lower conductive patterns 150. The formation of the metal-semiconductor compound layer 155 may include a metal layer deposition process and a heat treatment process.

Figure 6:
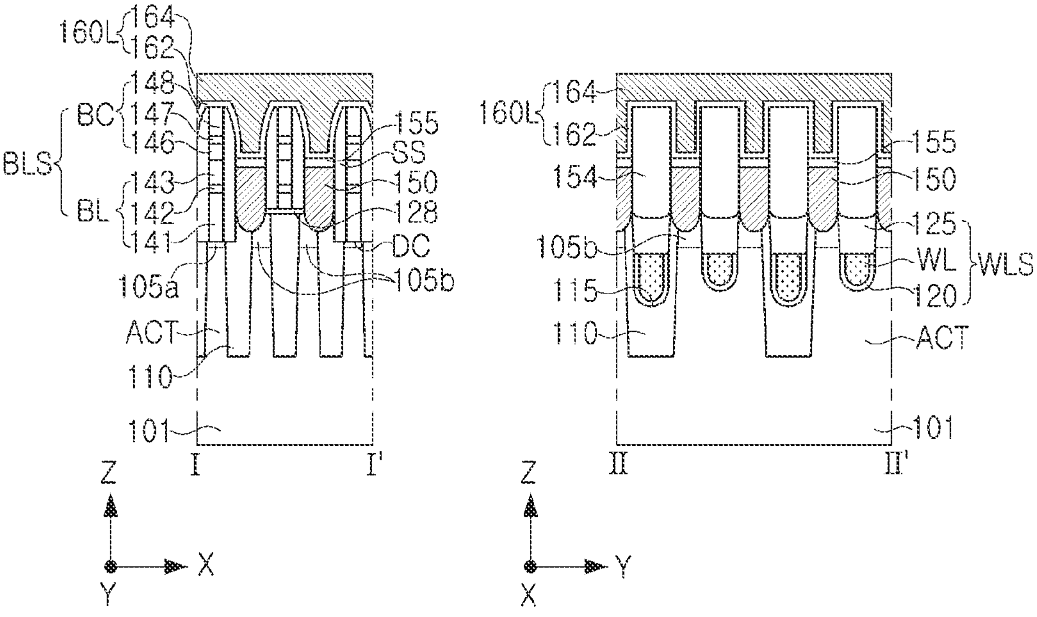

Referring to FIG. 6, an upper conductive layer 160L covering the metal-semiconductor compound layer 155 may be formed.

The upper conductive layer 160L may extend between the spacer structures SS to cover an upper surface of the metal-semiconductor compound layer 155. Forming the upper conductive layer 160L may include sequentially forming a barrier layer 162 and a conductive layer 164. The barrier layer 162 may be formed of a metal nitride, for example, at least one of titanium nitride (TiN), tantalum nitride (TaN), and tungsten nitride (WN). The conductive layer 164 may be formed of a conductive material, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

Figure 7:
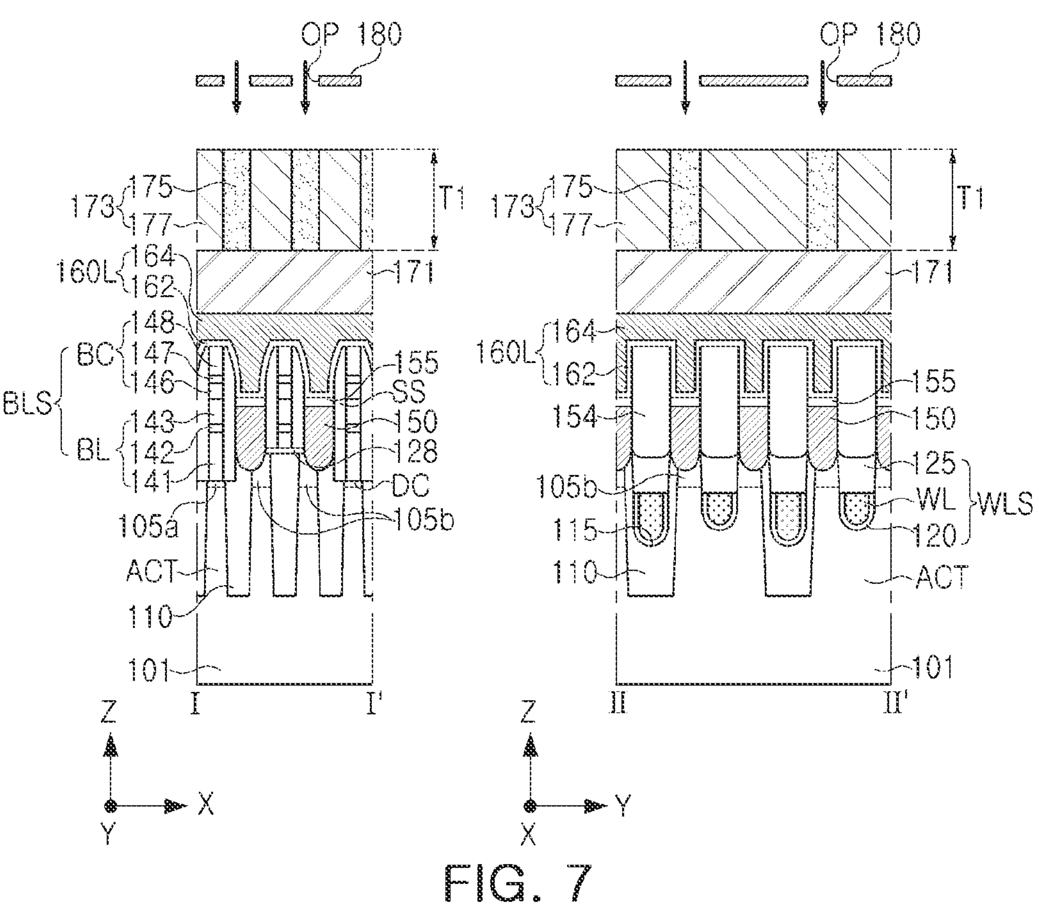

Referring to FIG. 7, after an adhesive layer 171 and a photoresist layer 173 are sequentially formed on the upper conductive layer 160L, an exposure process may be performed on the photoresist layer 173.

The adhesive layer 171 may be formed on the upper conductive layer 160L. The adhesive layer 171 may be formed to improve adhesion between an etch stop layer 168 and the photoresist layer 173. The photoresist layer 173 may be formed on the adhesive layer 171 to have the first thickness T1.

Thereafter, a photomask 180 may be disposed on the photoresist layer 173. The photomask 180 may include the transmissive portion OP exposing a first region of the photoresist layer 173. The photomask 180 may expose the first region of the photoresist layer 173, and mask a second region of the photoresist layer 173, A light source may be disposed on the photomask 180. Light may be irradiated onto the first region of the photoresist layer 173 from the light source through the transmissive portion OP of the photomask 180. Accordingly, the photoresist layer 173 may be divided into an exposed portion 175 and a non-exposed portion 177. The photoresist layer 173 may include the exposed portion 175 and the non-exposed portion 177. The exposed portion 175 and the non-exposed portion 177 may have a first thickness T1.

Figure 8:
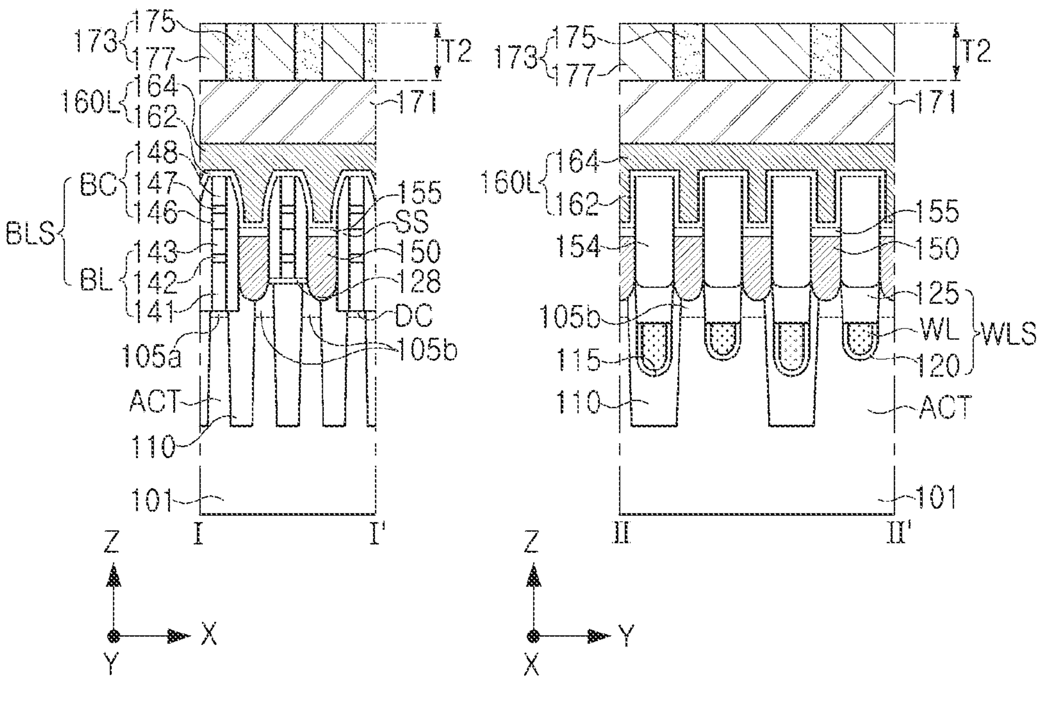

Referring to FIG. 8, an etch back process may be performed on the photoresist layer 173.

The photoresist layer 173 may be etched to a predetermined thickness to have a second thickness T2 less than the first thickness. In some implementations, the etch back process may be performed on the photoresist layer 173.

The exposed portion 175 and the non-exposed portion 177 of the photoresist layer 173 may be etched by substantially the same thickness. Accordingly, the exposed portion 175 and the non-exposed portion 177 may have a second thickness T2.

Figures 9, 10:
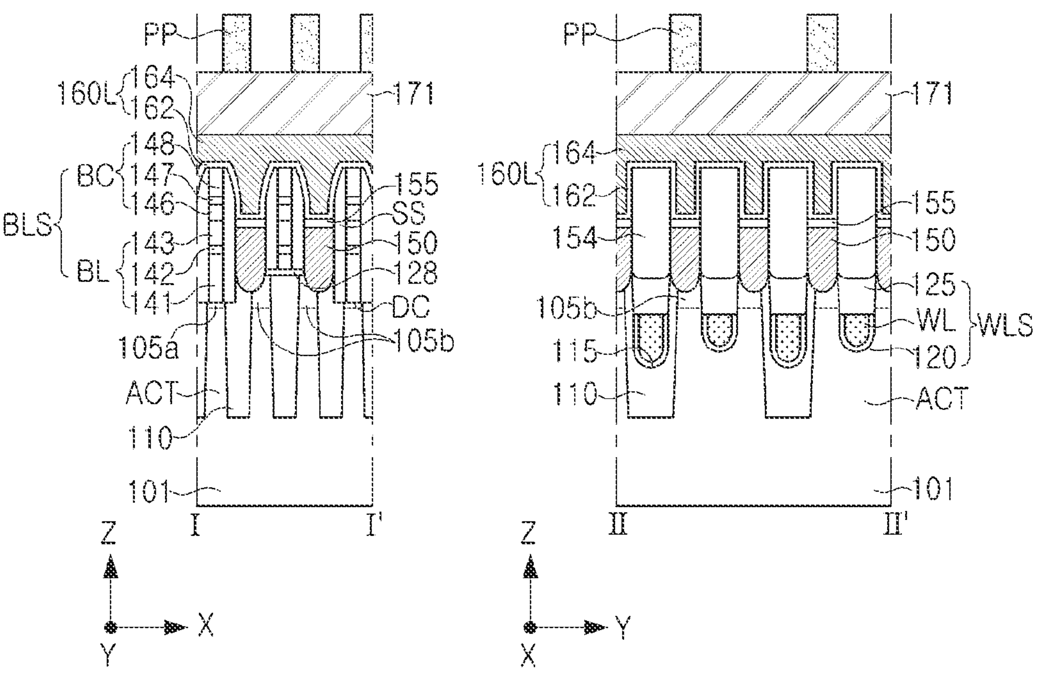

Referring to FIG. 9, a developing process may be performed on the photoresist layer 173.

With reference to FIG. 9, the non-exposed portion 177 may be selectively removed from the photoresist layer 173, the exposed portion 175 may remain. The remaining exposed portion may be included in the photoresist pattern PP. In some implementations, the photoresist pattern PP includes a plurality of pillar patterns. When the photoresist pattern PP has a high aspect ratio, the photoresist pattern PP may collapse. However, in the method of fabricating a semiconductor device according to example embodiments of the present disclosure, the aspect ratio of the photoresist pattern PP may be reduced by the etch back process (FIG. 8) of the photoresist layer performed before the developing process (FIG. 9), thereby preventing the photoresist pattern from collapsing in the developing process.

Referring to FIG. 10, insulating pattern holes 165H passing through a portion of the upper conductive layer (160L in FIG. 9) may be formed to form upper conductive patterns 160.

With reference to FIG. 10, the insulating pattern holes 165H passing through the upper conductive layer 160L may be formed using the photoresist pattern PP as an etching mask. Accordingly, a plurality of upper conductive patterns 160 separated by the insulating pattern holes 165H may be formed. The upper conductive patterns 160 may electrically connect the lower conductive patterns 150 to a data storage structure, as will be described with reference to FIG. 11 below. The upper conductive patterns 160 may be, for example, landing pads of a DRAM.

After the insulating pattern holes 165H are formed or while the insulating pattern holes 165H are formed, the adhesive layer 171 in FIG. 8 on the upper conductive patterns 160 and the photoresist pattern PP in FIG. 9 used as an etching mask may be removed.

Figure 11:
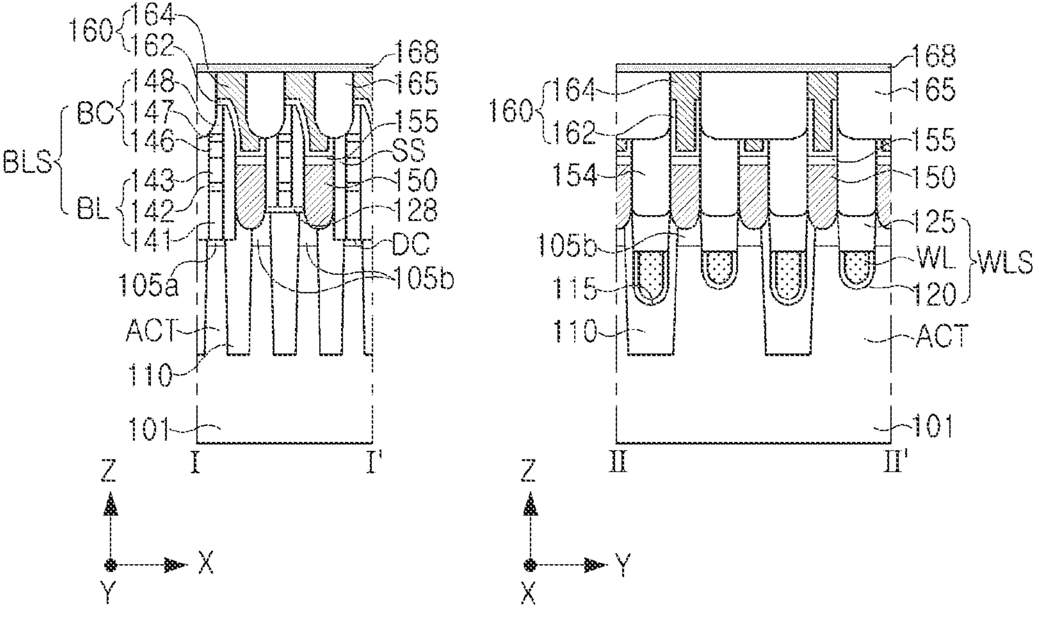

Referring to FIG. 11, insulating patterns 165 and the etch stop layer 168 may be formed.

The insulating patterns 165 may be formed by filling the insulating pattern holes (165H in FIG. 10) with an insulating material. The insulating patterns 165 may be formed of an insulating material, for example, at least one of silicon oxide, silicon nitride, and silicon oxynitride. In some implementations, the insulating patterns 165 are formed to have an upper surface positioned on a level substantially the same as that of an upper surface of the upper conductive pattern 160.

Thereafter, the etch stop layer 168 covering the upper conductive pattern 160 and the insulating patterns 165 may be formed. The etch stop layer 168 may be formed of, for example, at least one of silicon nitride and silicon oxynitride.

Figure 12:
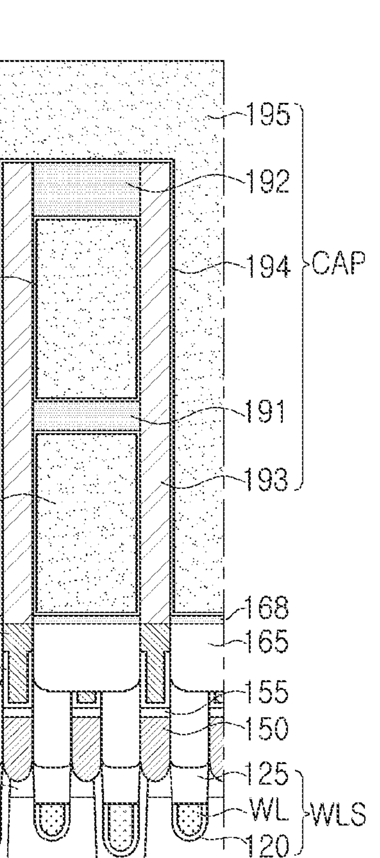

Referring to FIG. 12, a data storage structure CAP connected to the upper conductive pattern 160 may be formed.

The data storage structure CAP may store information and may be, for example, a capacitor structure of a DRAM. In some implementations, forming the data storage structure CAP includes forming lower electrodes 193 on the upper conductive pattern 160, forming a dielectric layer 194 covering the lower electrodes 193, and forming an upper electrode 195 covering the dielectric layer 194.

The lower electrodes 193 may be formed on the upper conductive pattern 160. The lower electrodes 193 may pass through the etch stop layer 168 to be in contact with the upper conductive pattern 160. The lower electrodes 193 may have a cylindrical shape, but the present disclosure is not limited thereto. In other implementations, the lower electrodes 193 may have a hollow cylinder or cup shape, or a planar shape. The lower electrodes 193 may be respectively formed of at least one of polycrystalline silicon (Si), titanium (Ti), titanium nitride (TiN), tantalum (Ta), tantalum nitride (TaN), tungsten (W), tungsten nitride (WN), and aluminum (Al).

One or more supporter layers 191 and 192 supporting the lower electrodes 193 may be formed between the adjacent lower electrodes 193. For example, a first supporter layer 191 and a second supporter layer 192 in contact with the lower electrodes 193 may be formed between the adjacent lower electrodes 193.

The dielectric layer 194 may be formed on surfaces of the lower electrodes 193 to cover the lower electrodes 193. The dielectric layer 194 may be formed to cover upper and lower surfaces of the supporter layers 191 and 192. The dielectric layer 194 may be formed to cover an upper surface of the etch stop layer 168.

Thereafter, the upper electrode 195 covering the dielectric layer 194 may be formed. The upper electrode 195 may fill a space between a plurality of lower electrodes 193 and a space between the supporter layers 191 and 192. Accordingly, a semiconductor device 100 including the data storage structure CAP may be formed.

According to example embodiments of the present disclosure, an etch back process may be performed between an exposure process and a process of developing a photoresist layer, thereby improving uniformity of photoresist pattern distribution and preventing a photoresist pattern from collapsing.

The various and beneficial advantages and effects of the discussed examples are not limited to the above description, and will be more easily understood in the course of describing specific examples.

While example implementations have been shown and described above, it will be apparent to those skilled in the art that modifications and variations could be made without departing from the scope of the present disclosure as defined by the appended claims.

What is claimed is:

1. A method of fabricating a semiconductor device, the method comprising:
 - forming a photoresist layer on a lower structure, the photoresist layer having a first thickness;
 - exposing a portion of the photoresist layer to form an exposed portion and a non-exposed portion of the photoresist layer;
 - removing part of the photoresist layer to form a photoresist layer having a second thickness that is smaller than the first thickness;
 - removing the exposed portion or the non-exposed portion of the photoresist layer having the second thickness to form a photoresist pattern;
 - etching at least a portion of the lower structure using the photoresist pattern as an etching mask; and
 - removing the photoresist pattern after etching the portion of the lower structure.

2. The method of claim 1, wherein
 - the first thickness is in a range from about 400 Å to about 1000 Å, and
 - the second thickness is in a range from about 250 Å to about 600 Å.

3. The method of claim 1, wherein
 - exposing the portion of the photoresist layer to form the exposed portion and the non-exposed portion of the photoresist layer includes using an extreme ultraviolet (EUV) exposure process, and
 - the photoresist layer includes an inorganic material.

4. The method of claim 1, further comprising:
 - baking the photoresist layer, after the forming the exposed portion and the non-exposed portion of the photoresist layer.

5. The method of claim 4, wherein removing a part of the photoresist layer to form the photoresist layer having the second thickness is performed after baking the photoresist layer.

6. The method of claim 1, wherein the photoresist pattern includes a plurality of pillar patterns.

7. A method of fabricating a semiconductor device, the method comprising:
 - loading a lower structure into a spinner;
 - forming a photoresist layer on the lower structure;
 - unloading a first substrate including the lower structure and the photoresist layer from the spinner;
 - loading the first substrate into a scanner, after the unloading the first substrate;
 - forming an exposed portion and a non-exposed portion in a first region and a second region of the photoresist layer using an exposure process, respectively, after the loading the first substrate into the scanner;
 - unloading a second substrate including the lower structure and the photoresist layer having the exposed portion and the non-exposed portion from the scanner, after the forming the exposed portion and the non-exposed portion of the photoresist layer;
 - loading the second substrate into the spinner, after the unloading the second substrate;
 - while the second substrate is in the spinner, partially removing the photoresist layer on the second substrate to form a photoresist layer having a reduced thickness, after the loading the second substrate into the spinner;
 - removing the non-exposed portion of the photoresist layer having the reduced thickness to form a pillar photoresist pattern;
 - etching the lower structure using the pillar photoresist pattern as an etching mask; and
 - removing the pillar photoresist pattern used as the etching mask.

8. The method of claim 7, further comprising:
 - baking the photoresist layer, after the forming the exposed portion and the non-exposed portion of the photoresist layer.

9. The method of claim 7, wherein forming the exposed portion and the non-exposed portion of the photoresist layer includes:
 - disposing a photomask on the photoresist layer, the photomask including a transmissive portion exposing the first region of the photoresist layer; and
 - irradiating light onto the first region of the photoresist layer through the transmissive portion of the photomask.

10. A method of fabricating a semiconductor device, the method comprising:
 - forming a substrate including active regions;
 - forming word lines crossing the active regions on the substrate;
 - forming bit lines intersecting the word lines and electrically connected to first impurity regions of the active regions;
 - forming lower conductive patterns electrically connected to second impurity regions of the active regions and between the bit lines adjacent to each other; and
 - forming upper conductive patterns electrically connected to the lower conductive patterns,
 - wherein forming the upper conductive patterns includes
   - forming an upper conductive layer covering the lower conductive patterns,
   - forming a photoresist layer having a first thickness and on the upper conductive layer,
   - forming an exposed portion and a non-exposed portion in a first region and a second region of the photoresist layer using an exposure process, respectively,
   - removing a part of the photoresist layer such that the photoresist layer has a second thickness that is smaller than the first thickness,
   - selectively removing the non-exposed portion of the photoresist layer to form a photoresist pattern,
   - forming an opening separating the upper conductive layer into the upper conductive patterns using the photoresist pattern as an etching mask,
   - removing the photoresist pattern used as the etching mask, and
   - forming an insulating pattern in the opening.

11. The method of claim 10, wherein the upper conductive patterns are spaced apart from each other by the insulating pattern.

12. The method of claim 10, wherein forming the exposed portion and the non-exposed portion of the photoresist layer includes:
 - disposing a photomask on the photoresist layer, the photomask including a transmissive portion exposing the first region of the photoresist layer; and irradiating light onto the first region of the photoresist layer through the transmissive portion of the photomask.

13. The method of claim 10, wherein the photoresist layer includes an inorganic material.

14. The method of claim 10, wherein the photoresist pattern includes a plurality of pillar patterns.

15. The method of claim 10, wherein the first thickness is in a range from about 400 Å to about 1000 Å, and the second thickness is in a range from about 250 Å to about 600 Å.

16. The method of claim 10, further comprising:

forming a data storage structure electrically connected to the upper conductive patterns.

17. The method of claim 16, wherein forming the data storage structure includes:

forming lower electrodes on the upper conductive patterns;

forming a dielectric layer covering the lower electrodes; and forming an upper electrode covering the dielectric layer.

* * * * *